United States Patent
Cho

(10) Patent No.: US 8,697,502 B2
(45) Date of Patent: Apr. 15, 2014

(54) METHOD FOR FORMING SEMICONDUCTOR DEVICE

(71) Applicant: SK hynix Inc., Icheon-si (KR)

(72) Inventor: Young Man Cho, Icheon-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/722,900

(22) Filed: Dec. 20, 2012

(65) Prior Publication Data

US 2013/0323911 A1    Dec. 5, 2013

(30) Foreign Application Priority Data

May 29, 2012  (KR) .......................... 10-2012-0056911

(51) Int. Cl.
*H01L 21/00*  (2006.01)

(52) U.S. Cl.
USPC .......................................... 438/151; 438/284

(58) Field of Classification Search
USPC .................................. 438/151–166, 280, 284
See application file for complete search history.

(56) References Cited

U.S. PATENT DOCUMENTS

| | | | |
|---|---|---|---|
| 6,413,802 B1 * | 7/2002 | Hu et al. | 438/151 |
| 2005/0263831 A1 * | 12/2005 | Doris et al. | 257/401 |
| 2006/0105529 A1 | 5/2006 | Lee | |

FOREIGN PATENT DOCUMENTS

| | | | |
|---|---|---|---|
| KR | 1020060054667 A | 5/2006 | |
| KR | 1020090043344 A | 5/2009 | |

* cited by examiner

*Primary Examiner* — Richard Booth

(57) ABSTRACT

A method for forming a semiconductor device is disclosed. In the semiconductor device, a gate is formed to enclose a fin structure in a $6F^2$ saddle fin gate structure transistor, so that the size of a channel region increases. In accordance with an aspect of the present invention, a method for forming a semiconductor device includes: defining an active region by forming a device isolation film over a semiconductor substrate; forming a first recess extending to a first level in the active region; forming a sacrificial film at a lower portion of the first recess; forming a fin structure over the sacrificial film; separating the fin structure from the semiconductor substrate in the active region by removing the sacrificial film and forming a hole between the fin structure and the active region; and forming a gate to enclose the fin structure.

11 Claims, 4 Drawing Sheets

METHOD FOR FORMING SEMICONDUCTOR DEVICE

CROSS-REFERENCE TO RELATED APPLICATION

The priority of Korean patent application No. 10-2012-0056911 filed on 29 May 2012, the disclosure of which is hereby incorporated by reference in its entirety, is claimed.

BACKGROUND

Embodiments relate to a method for forming a semiconductor device, and more particularly to a technology in which a gate has a fin structure with an increased channel length. More specifically, particular embodiments relate to a $6F^2$ saddle fin gate structure with an increased channel region.

Generally, a semiconductor is a material that falls within an intermediate region between a conductor and a nonconductor from among materials affected by electrical conductivity. Although a semiconductor is similar to a nonconductor in a pure state, electrical conductivity of the semiconductor device is increased by impurity implantation or other manipulation. The semiconductor is used to form a semiconductor device such as a transistor through impurity implantation and conductor connection. A device that has various functions simultaneously while being formed of a semiconductor element is referred to as a semiconductor device. A representative example of the semiconductor device is a semiconductor memory device.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs using a semiconductor property whereby an electrical conductivity changes depending on environment. The transistor has three regions, i.e., a gate, a source, and a drain. Electric charges are moved between the source and the drain according to a control signal input to the gate of the transistor. The charges between the source and the drain move through a channel region in accordance with the properties and operation of the semiconductor device.

In the case where a general transistor is formed over a semiconductor substrate, a method of forming a gate over the semiconductor substrate and doping impurities into both sides of the gate so as to form a source and a drain has been used. As the data storage capacity of a semiconductor memory device has increased and integration degree has increased, the size of each unit cell must be gradually decreased.

That is, the design rule of the capacitor and the transistor included in the unit cell has been reduced. Thus, as the channel length of a cell transistor is gradually decreased, the short channel effect, Drain Induced Barrier Lowering (DIBL), etc. occur in the general transistor and thus operational reliability is decreased. By maintaining a threshold voltage such that the cell transistor performs a normal operation, it is possible to solve the phenomena generated due to decrease in channel length. In general, as the channel length of the transistor shortens, the concentration of impurities doped into a region in which the channel is formed has been increased.

However, if the concentration of the impurities doped into the channel region is increased while the design rule is reduced to 100 nm or less, the electric field of a Storage Node (SN) junction is increased, thereby deteriorating the refresh characteristics of a semiconductor memory device. In order to solve this problem, a recessed gate and a saddle fin structure gate have been developed to physically increase a channel length.

Specifically, although a horizontal channel width of the saddle fin structure transistor is short, a vertical channel length thereof can be guaranteed so that doping concentration can be decreased, and refresh characteristics are prevented from being deteriorated.

However, a fin width of the saddle fin structure transistor is extremely reduced due to size reduction of a very small-sized cell of 30 nm or less, so that the effect of channel increase is unavoidably deteriorated.

BRIEF SUMMARY OF THE INVENTION

Various embodiments of the present invention are directed to providing a method for forming a semiconductor device that substantially obviates one or more problems due to limitations and disadvantages of the related art.

An embodiment of the present invention relates to a method for forming a semiconductor device in which a gate is formed to enclose a fin structure in a $6F^2$ saddle fin gate structure transistor, so that the size of a channel region increases.

An embodiment of the present invention relates to a method for forming a semiconductor device, so that an operation current of a cell transistor increases and the operation current and gate control performance of the cell transistor can be improved.

In accordance with an aspect of the present invention, a method for forming a semiconductor device includes: defining an active region by forming a device isolation film over a semiconductor substrate; forming a first recess extending to a first level in the active region; forming a sacrificial film at a lower portion of the first recess; forming a fin structure over the sacrificial film; separating the fin structure from the semiconductor substrate in the active region by removing the sacrificial film and forming a hole between the fin structure and the active region; and forming a gate to enclose the fin structure.

The forming the fin structure includes: forming an epitaxial growth layer over the sacrificial film; and forming a second recess by partially etching the silicon epitaxial growth layer and the device isolation film, and forming the remaining silicon epitaxial growth layer as the fin structure.

The forming the gate to enclose the fin structure includes: depositing a polysilicon material to fill the hole and the second recess; and forming the gate by etching back the polysilicon material.

The forming the first recess includes: forming a first hard mask pattern over the device isolation film and the active region; and etching the active region using the first hard mask pattern as a mask to form the first recess at the lower portion of the active region.

The method may further include further etching the first hard mask pattern formed over the device isolation film to form a second hard mask pattern to define a region where the gate is formed.

The step of forming the second recess includes: forming the second recess in the device isolation film and in the active region using the second hard mask pattern as a mask.

The first hard mask pattern and the second hard mask pattern include a polysilicon material. The first recess is formed to a depth of between about 1000 Å to 1500 Å.

The sacrificial film includes a silicon germanium (SiGe) material or a silicon nitride (SiN) material. The sacrificial film is formed to have a thickness of between about 100 Å to 300 Å.

The removing of the sacrificial film includes wet-etching the sacrificial film using a solution in which the ratio of hydrogen fluoride (HF), acetic acid ($CH_3COOH$), and hydrogen peroxide ($H_2O_2$) is 1:50:50.

It is to be understood that both the foregoing general description and the following detailed description are exemplary and explanatory and are intended to provide further explanation.

DESCRIPTION OF EMBODIMENTS

Reference will now be made in detail to embodiments, examples of which are illustrated in the accompanying drawings. Wherever possible, the same reference numbers will be used throughout the drawings to refer to the same or like parts. In the following description of the present invention, a detailed description of related known configurations or functions incorporated herein will be omitted when it may make the subject matter unclear.

A method for forming a semiconductor device according to embodiments will hereinafter be described with reference to FIGS. 1 to 3.

Figure 1:
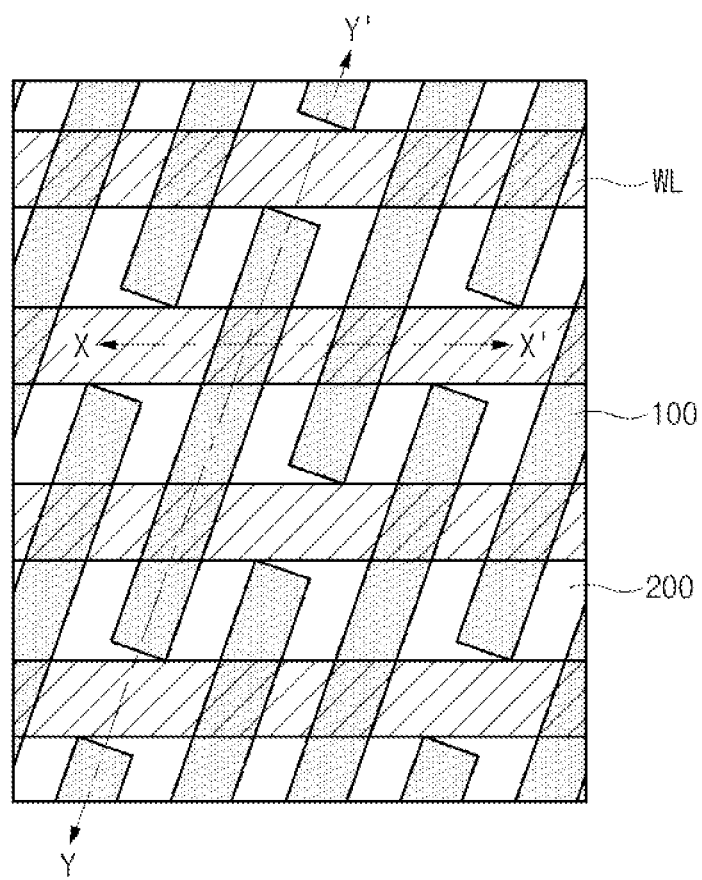
FIG. 1 is a plan view illustrating a semiconductor device.

FIG. 1 is a plan view illustrating a $6F^2$-type semiconductor device according to an embodiment.

Referring to FIG. 1, an active region 100 is defined by a device isolation film 200 over a semiconductor substrate, and the active region 100 is formed to cross two word line (WL) gates.

A semiconductor memory cell divided into a plurality of sections by a plurality of columns includes one or more active regions 100 and a bit line contact (not shown). The active regions 100 are arranged at intervals of a predetermined distance in a manner that column directions of the individual columns are angled against longitudinal directions thereof and include a storage node contact region formed at both ends of each active region 100, and a bit line contact region formed at the center of each active region 100. The bit line contact (not shown) is coupled to the bit line contact region over the active region 100, overlaps with at least some portion of the bit line contact region and is extended to some parts of the next contiguous column.

FIGS. 2a to 2f are cross-sectional views illustrating a method for forming a semiconductor device according to an embodiment. In each of FIGS. 2a to 2g, (i) is a cross-sectional view illustrating a semiconductor device taken along the line of a Y-axis, and (ii) is a cross-sectional view illustrating a semiconductor device taken along the line of an X-axis.

Figure 2A:
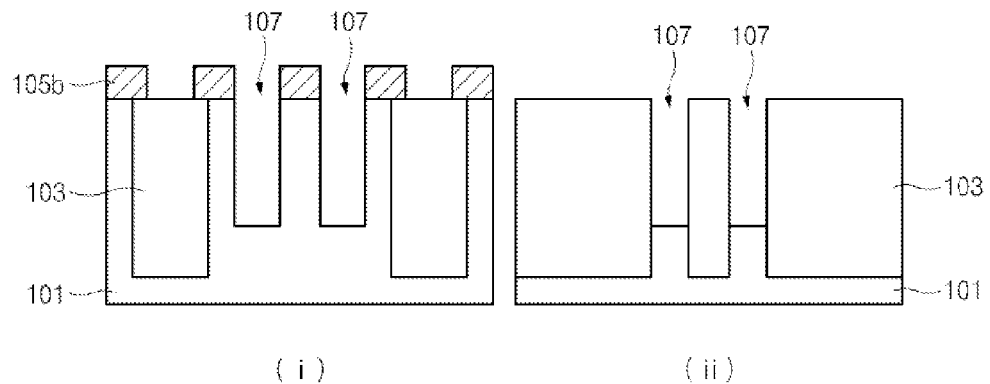
FIGS. 2a(i) to 2f(ii) are cross-sectional views illustrating a method for forming a semiconductor device according to an embodiment of the present invention.

Referring to FIG. 2a, a hard mask pattern 105a for forming a recess over an active region 101 defined by a device isolation film 103, is formed over a semiconductor substrate. That is, an upper part of the device isolation film 103 is covered with the hard mask pattern 105a, and some parts (i.e., a region for recess formation) of the upper part of the active region 101 are opened. The hard mask pattern 105a may be formed of a polysilicon material in such a manner that the hard mask pattern formed over the device isolation film 103 is etched in a subsequent etching process.

Figure 2B:
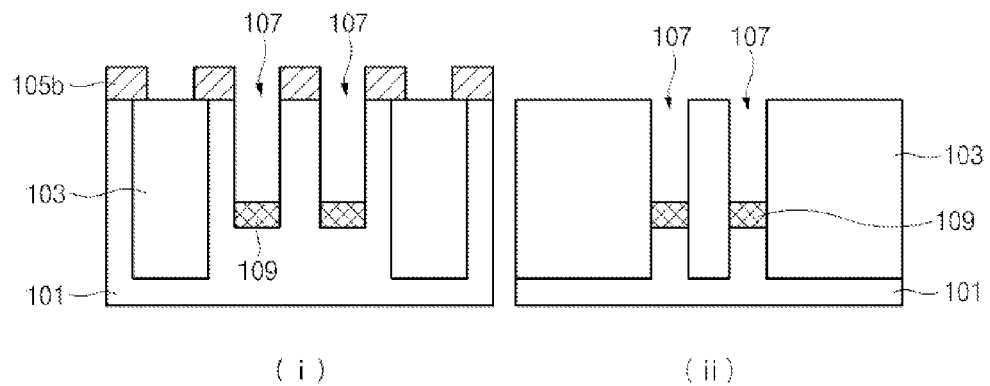

Subsequently, if the etching process is performed, a recess 107 is formed in the active region 101, and some parts of the hard mask pattern 105a formed over the device isolation film 103 are etched, so that a hard mask pattern 105b for a subsequent etching process is formed as shown in FIG. 2b. The device isolation film 103 is not etched but the hard mask pattern 105a is etched so that an upper surface of the device isolation film 103 is exposed. In this case, the recess 107 may be formed more deeply than a recess for forming a general buried gate. The recess 107 may have a depth of about 1000 Å to 1500 Å.

Referring to FIG. 2b, a silicon germanium (SiGe) material or a silicon nitride (SiN) material is deposited at the bottom of the recess 107 of the active region 101, and is then etched so that a sacrificial film 109 is formed to have a predetermined thickness. Preferably, the sacrificial film 109 may have a thickness of about 100 Å to 300 Å.

Figure 2C:
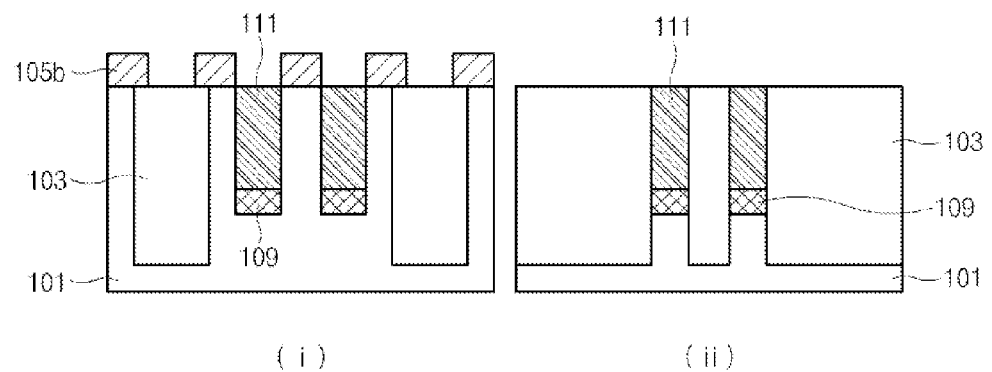

Subsequently, as shown in FIG. 2c, a silicon epitaxial growth layer 111 is formed over the sacrificial film 109 located at the bottom in the recess 107. In this case, the silicon epitaxial growth layer 111 may be formed by depositing/growing a monocrystalline silicon film.

Figure 2D:
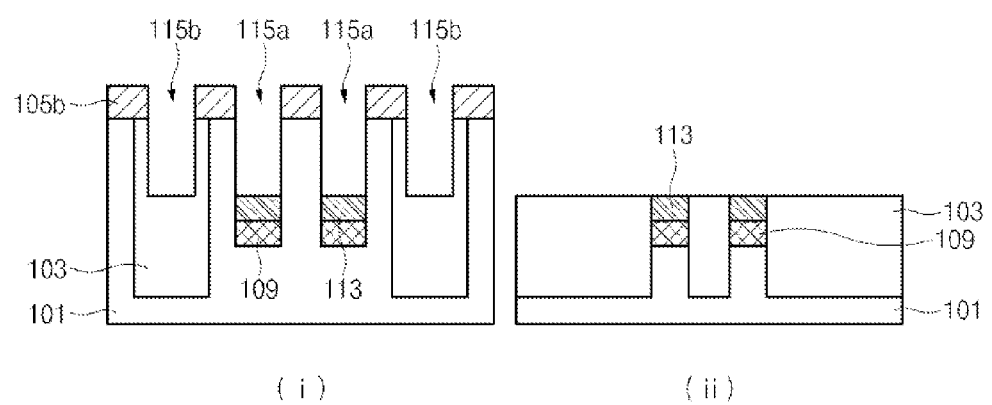

Referring to FIG. 2d, when an etching process is performed using the hard mask pattern 105b of FIG. 2a as a mask, a fin structure 113 having a predetermined thickness is formed by etching the device isolation film 103 and the epitaxial growth layer 111, and recesses (115a, 115b) for forming a buried gate are formed. In this case, the recess 115a and 115b may have the same or similar depth, and each of the recesses 115a and 115b may have a thickness of about 1000 Å.

Figure 2E:
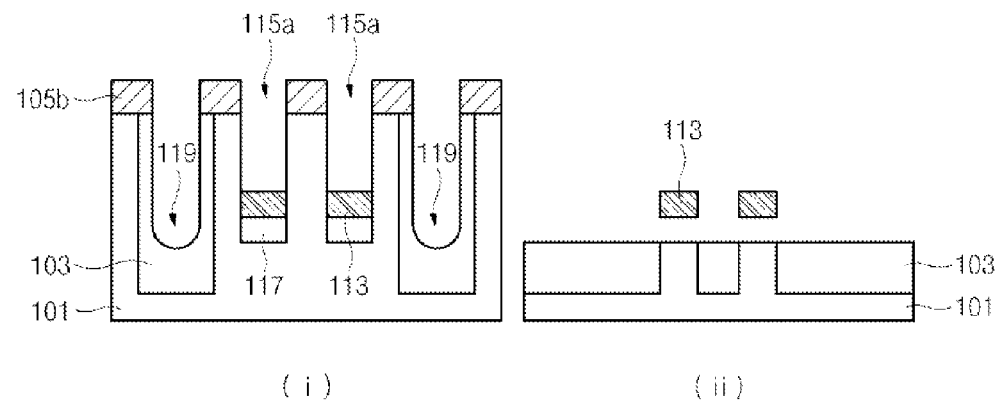

Referring to FIG. 2e, the sacrificial film 109 of FIG. 2b is wet-etched so that a hole 117 is formed at the position. The recess 115b of FIG. 2e is also etched while the sacrificial film 109 is removed to form a recess 119. That is, as can be seen from the cross-sectional view (ii), the device isolation film 103 is etched to expose a sidewall of the sacrificial film 109, and the exposed sacrificial film 109 is wet-etched, so that the fin structure 113 is separated from the active region 101. When the sacrificial film 109 is wet-etched, a solution can be used in which a mixture ratio of hydrogen fluoride (HF), acetic acid ($CH_3COOH$), and hydrogen peroxide ($H_2O_2$) is about 1:50:50.

Figure 2F:
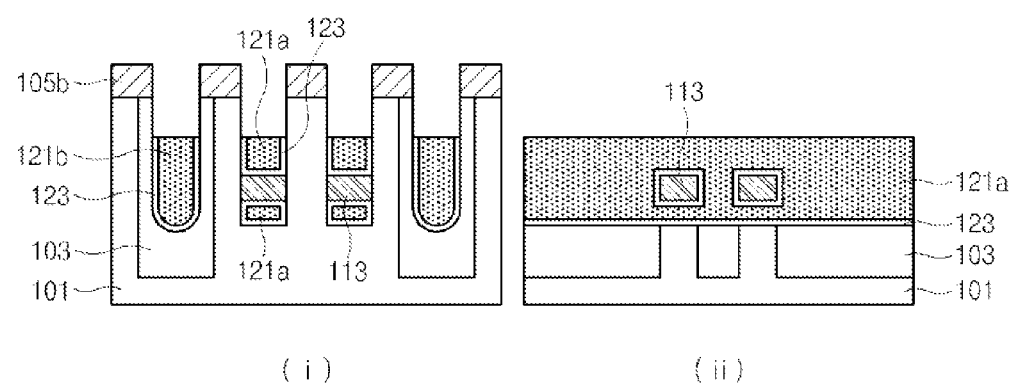

Referring to FIG. 2f, a gate oxide film 123 having a predetermined thickness is formed over the entire inner surface of each recess (115a, 115b). The gate oxide film 123 also formed over an inner surface of the recesses 115a and 115b and the hole 117. Polysilicon material is deposited over the gate oxide film 123 and is then planarized so that buried gates (121a, 121b) are formed. As a result, the gate 121a is formed in the hole 117 to enclose a fin structure 113 acting as a channel. Accordingly, a channel is formed in such a manner of being surrounded by the gate 121a. In this case, chemical mechanical polishing (CMP) or etch-back process may be used for such planarization.

Thereafter, a nitride film (not shown) is formed over the buried gates (121a, 121b). A bit line contact plug (not shown) is formed to be coupled to the gate 121a. Then, a bit line (not shown) is formed to be coupled to the bit line contact plug. In addition, after a storage node contact plug (not shown) is formed to be coupled to the gate 121a, a capacitor (not shown) is formed, so that a surround-gate type semiconductor device in which the fin structure is surrounded by the gate 121a is formed.

The saddle fin structure gate formed by the above-mentioned methods is formed in such a manner that the fin structure 113 is surrounded by the gate 121a, so that the size of a channel region can be elongated.

As described above, the recess 107 for forming the buried gate in the active region is formed more deeply than a general recess, the sacrificial film 109 having a predetermined thickness is formed at the bottom of the recess 107, and the fin structure 113 is formed over the sacrificial film 109. Thereafter, the sacrificial film 109 is removed, a polysilicon material fills a space where the sacrificial film 109 was removed, a channel (fin structure) is formed at a specific position which is higher than a bottom of the device isolation film 103, and the gate of the semiconductor device is formed to enclose the fin structure 113. The fin structure 113 be surrounded by the gate 121a, so that a channel region can be elongated.

As is apparent from the above description, the semiconductor device according to forms a surrounding-type channel under a 6F$^2$ buried saddle fin gate structure, so that a length of a channel region can increase.

In addition, the semiconductor device is configured to increase the size of channel region even in a very small-sized cell of whose minimum pattern size is about 30 nm or less. Since the channel length is elongated, operation current of a cell transistor and gate controllability thereof can be improved.

Those skilled in the art will appreciate that embodiments may be carried out in other specific ways than those set forth herein without departing from the spirit and essential characteristics of the present invention. The above exemplary embodiments are therefore to be construed in all aspects as illustrative and not restrictive. The scope of the subject matter should be determined by the appended claims and their legal equivalents, not by the above description, and all changes coming within the meaning and equivalency range of the appended claims are intended to be embraced therein. Claims that are not explicitly cited in each other in the appended claims may be presented in combination as an exemplary embodiment or included as a new claim by a subsequent amendment after the application is filed.

The above embodiments are illustrative and not limitative. Various alternatives and equivalents are possible. Embodiments are not limited by the type of deposition, etching polishing, and patterning steps described herein. Nor are embodiments limited to any specific type of semiconductor device. For example, embodiments may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
    defining an active region by forming a device isolation film over a semiconductor substrate;
    forming a first recess extending to a first level in the active region;
    forming a sacrificial film at a lower portion of the first recess;
    forming a fin structure over the sacrificial film;
    separating the fin structure from the semiconductor substrate in the active region by removing the sacrificial film and forming a hole between the fin structure and the active region; and
    forming a gate to enclose the fin structure.

2. The method according to claim 1, wherein the forming the fin structure includes:
    forming an epitaxial growth layer over the sacrificial film; and
    forming a second recess by partially etching the silicon epitaxial growth layer and the device isolation film, and forming the remaining silicon epitaxial growth layer as the fin structure.

3. The method according to claim 2, wherein the forming the gate to enclose the fin structure includes:
    depositing a polysilicon material to fill the hole and the second recess; and
    forming the gate by etching back the polysilicon material.

4. The method according to claim 2, wherein the forming the first recess includes:
    forming a first hard mask pattern over the device isolation film and the active region; and
    etching the active region using the first hard mask pattern as a mask to form the first recess at the lower portion of the active region.

5. The method according to claim 4, the method further comprising:
    further etching the first hard mask pattern formed over the device isolation film to form a second hard mask pattern to define a region where the gate is formed.

6. The method according to claim 5, wherein the step of forming the second recess includes:
    forming the second recess in the device isolation film and in the active region using the second hard mask pattern as a mask.

7. The method according to claim 6, wherein the first hard mask pattern and the second hard mask pattern include a polysilicon material.

8. The method according to claim 1, wherein the first recess is formed to a depth of between about 1000 Å to 1500 Å.

9. The method according to claim 1, wherein the sacrificial film includes a silicon germanium (SiGe) material or a silicon nitride (SiN) material.

10. The method according to claim 1, wherein the sacrificial film is formed to have a thickness of between about 100 Å to 300 Å.

11. The method according to claim 1,
    wherein the removing of the sacrificial film includes wet-etching the sacrificial film using a solution in which the ratio of hydrogen fluoride (HF), acetic acid (CH$_3$COOH), and hydrogen peroxide (H$_2$O$_2$) is 1:50:50.

* * * * *